United States Patent
Takahashi et al.

(10) Patent No.: US 6,798,255 B2
(45) Date of Patent: Sep. 28, 2004

(54) SEMICONDUCTOR INTEGRATED CIRCUIT DEVICE

(75) Inventors: Fumikazu Takahashi, Hitachi (JP);
Tatsumi Yamauchi, Hitachiota (JP);
Fumio Murabayashi, Urizura (JP);
Kazuhisa Miyamoto, Machida (JP);
Kazuharu Kuchimachi, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/931,250

(22) Filed: Aug. 17, 2001

(65) Prior Publication Data

US 2002/0175718 A1 Nov. 28, 2002

(30) Foreign Application Priority Data

May 24, 2001 (JP) .......................................... 2001-155551

(51) Int. Cl.[7] .............................................. H03B 21/00
(52) U.S. Cl. ........................................ 327/109; 327/566
(58) Field of Search ................................. 327/108, 109, 327/110, 111, 565, 566

(56) References Cited

U.S. PATENT DOCUMENTS

| | | | |
|---|---|---|---|
| 4,849,658 A | 7/1989 | Iwamura et al. | 326/110 |
| 6,084,800 A | 7/2000 | Choi et al. | 365/185.23 |
| 6,088,286 A * | 7/2000 | Yamauchi et al. | 365/230.03 |
| 6,271,713 B1 * | 8/2001 | Krishnamurthy | 327/170 |
| 6,366,520 B1 * | 4/2002 | Huber | 326/83 |
| 6,472,917 B2 * | 10/2002 | Yamauchi et al. | 327/170 |

FOREIGN PATENT DOCUMENTS

| | | |
|---|---|---|
| JP | 2-165724 | 6/1990 |
| JP | 11-203858 | 7/1999 |
| JP | 11-317505 | 11/1999 |
| JP | 2000-058785 | 2/2000 |
| JP | 2000-243085 | 9/2000 |
| JP | 2000-268563 | 9/2000 |
| WO | 98/42021 | 9/1998 |

* cited by examiner

Primary Examiner—Timothy P. Callahan
Assistant Examiner—Cassandra Cox
(74) Attorney, Agent, or Firm—Antonelli, Terry, Stout & Kraus, LLP (57) ABSTRACT

A semiconductor integrated circuit device including a driver circuit, a first long-distance wiring connected to the driver circuit, and a plurality of gate circuits connected over the entire length of the first long-distance wiring, so that an output signal of the driver circuit is received by the plurality of gate circuits via the first long-distance wiring, wherein a node arranged in the vicinity of an input terminal of the gate circuit connected to an input terminal of the driver circuit and an end of the first long-distance wiring is connected by a second long-distance wiring and a speed-increasing circuit.

22 Claims, 6 Drawing Sheets

SEMICONDUCTOR INTEGRATED CIRCUIT DEVICE

BACKGROUND OF THE INVENTION

The present invention relates to a semiconductor integrated circuit device and in particular to a semiconductor integrated circuit device having a large chip size and a fine wiring in which a ratio of a wiring delay in a critical path delay time is reduced, thereby improving the operation speed.

Conventionally, the speed of a critical path including a long-distance wiring in a semiconductor integrated circuit device has been improved by (a) improvement of a load drive force of a gate circuit, (b) increase of width of the long-distance wiring, (c) dispersion of output load by gate circuit multiplication, and the like. When the ratio of a wiring delay in the critical path is small as compared to a delay time of the gate circuit, the speed increasing methods (a) to (c) can have a significant effect.

However, the effect of such methods (a) to (c) for increasing the speed becomes smaller as a semiconductor integrated circuit device increases its size and becomes finer. In a gate circuit method for driving all at once multi-fan out long-distance wiring having a large ratio of wiring delay in the critical path as compared to a gate circuit delay time, its output load is large and its output waveform becomes dull. Furthermore, after passing through the long-distance wiring, the waveform becomes greatly dull due to the wiring RC time constant. The reason of reduction of the effect of the methods (a) to (c) will be detailed below.

Method (a) can have a significant effect while the wiring resistance is sufficiently small as compared to the operation resistance of the load drive transistor of the gate circuit but the wiring resistance cannot be ignored as compared to the operation resistance of the load drive transistor of the gate circuit as the chip size becomes greater and the wiring becomes finer. Thus, method (a) can have an effect for the capacity load but cannot have a significant effect for the resistance load such as the wiring resistance. Method (b) is usually used together with method (a). That is, when method (b) is used to increase the wiring width and reduce the wiring resistance, the load capacity component is increased and accordingly, method (a) is used to increase the speed of the gate circuit for driving the long-distance wiring. However, when the wiring width is increased, although the wiring resistance is reduced, the wiring capacity is increased. Accordingly, the wiring delay time can be approximated by the product of the wiring resistance and the wiring capacity and the improvement of the wiring delay itself is not great. Furthermore, method (a) has a limitation from the viewpoint of the area overhead or the power consumption and the effect of increasing the speed is not sufficient. Method (c) or a technique of inserting a relay buffer in the middle of the long-distance wiring for increasing the speed also has a problem that two stages of inverter should be inserted for matching the signal polarity and increasing the speed in all cases is impossible due to the area problem.

As has been described above, increase of the wiring delay due to a long-distance wiring and the problem that a path passing through a gate circuit in the vicinity of the long-distance wiring end becomes a critical path go in the opposite direction against fine configuration of a semiconductor integrated circuit. This should be taken into consideration in future.

SUMMARY OF THE INVENTION

It is therefore an object of the present invention to suppress an area overhead, to reduce a ratio of a delay time caused by a wiring resistance in a critical path in a semiconductor integrated circuit, thereby increasing the speed of the critical path, and to increase the operation speed of a semiconductor integrated circuit device.

The present invention employs means as follows in order to achieve the aforementioned object.

The present invention provides a semiconductor integrated circuit device including a driver circuit 100, a first long-distance wiring 104 connected to the driver circuit 100, and a plurality of gate circuits 103 distributed over and connected to the entire length of the first long-distance wiring 104, wherein an output signal of the driver circuit 100 is received via the first long-distance wiring 104 by the plurality of gate circuits 103, and the driver circuit 100 has an input circuit connected to a node 105 in the vicinity of an input terminal of the gate circuit 103 connected to the end of the first long-distance wiring 104 using a second long-distance wiring 106 and a speed-increasing circuit 107.

According to the present invention, in a gate circuit method for all-at-once driving multiple long-distance wiring fan-outs, a signal change is accelerated not only from one end of the driver circuit 100 but also from the other end by using a second long-distance wiring 106 and a speed-increasing circuit 107 from an early stage, thereby enabling to significantly reduce the wiring delay time and increase the critical path speed as well as to improve the operation speed of the semiconductor integrated circuit device. Moreover, since a waveform in the vicinity of the long-distance wiring end is driven by the speed-increasing circuit arranged physically in the vicinity, the waveform becomes sharp and a high-speed response of the receiver circuit can be obtained.

DETAILED DESCRIPTION OF EMBODIMENTS

Description will now be directed to the a semiconductor integrated circuit device as embodiments of the present invention with reference to the attached drawings. In the drawings, like components are denoted by like reference symbols.

Figure 1:
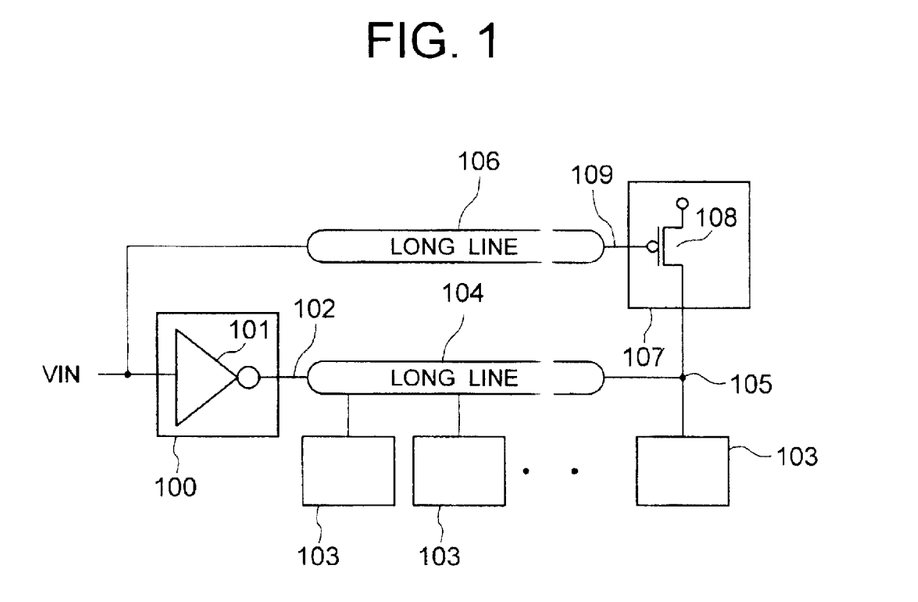
FIG. 1 shows a semiconductor integrated circuit device according to a first embodiment of the present invention.

FIG. 1 shows a semiconductor integrated circuit device according to a first embodiment of the present invention. In the figure, VIN denotes an input signal, 100 denotes a driver circuit having a CMOS inverter 101, 104 denotes a first long-distance wiring, 103 denotes a plurality of subsequent-stage gate circuits connected at approximately identical interval on the first long-distance wiring 104, 106 denotes a second long-distance wiring, and 107 denotes a speed-increasing circuit having a PMOS transistor 108. This configuration is characterized in that for example, in a drive method for all-at-once driving a plenty of fan-outs and a long-distance wiring such as a memory word line drive method, i.e., in the configuration of the driver circuit 100 for driving the first long-distance wiring 104 and the plurality of gate circuits 103, an input of the driver circuit 100 and an end node 105 of the first long-distance wiring 104 (the node 105 in the vicinity of the input terminal of the gate circuit 103 arranged physically at the farthest end viewed from an output node 102 of the CMOS inverter 101) is by-passed using the second long-distance wiring 106 and the speed-increasing circuit 107.

Next, explanation will be given on the circuit operation. When the input signal VIN is changed from a high level to a low level, the output node 102 of the CMOS inverter 101 is changed from low to high, and the node 105 is also changed from low to high. Here, the time (wiring delay time) required for the signal change of the node 102 to reach the node 105 is approximately a product of the wiring resistance of the long-distance wiring 104 and the entire capacitance formed on the long-distance wiring 104 (total of the wiring capacity of the long-distance wiring and the input capacity of the plurality of gate circuits 103 which are fan-out of the CMOS inverter 101). On the other hand, when the input signal VIN is changed from high to low, the input node 109 of the speed-increasing circuit 107 via the second long-distance wiring 106 is also changed from high to low. And the PMOS transistor 108 turns on to increase the potential of the node 105 to high in the same way as the drive of the aforementioned CMOS inverter 101. In the first long-distance wiring 104 and the second long-distance wiring 106 having an identical length, the wiring delay time of the second long-distance wiring 106 is by far shorter than the first long-distance wiring 104 because there is no gate circuit 103 connected as a fan out. Accordingly, when the input signal VIN is changed from high to low, the signal change start time from high to low of the node 109 is by far earlier than the signal change start time of the node 105 changed by the output signal transferred through the long-distance wiring 104 by drive of the CMOS inverter 101 and accordingly, the node 105 can start the signal change by the speed-increasing circuit 107 without waiting for the signal sent through the first long-distance wiring 104. When the input signal VIN is changed from the low level to the high level, the PMOS transistor 108 in the speed-increasing circuit 107 is cut off and the potential of the node 105 is driven only by the CMOS inverter 101 and pulled down from high to low by the first long-distance distance wiring 104.

Figure 2:
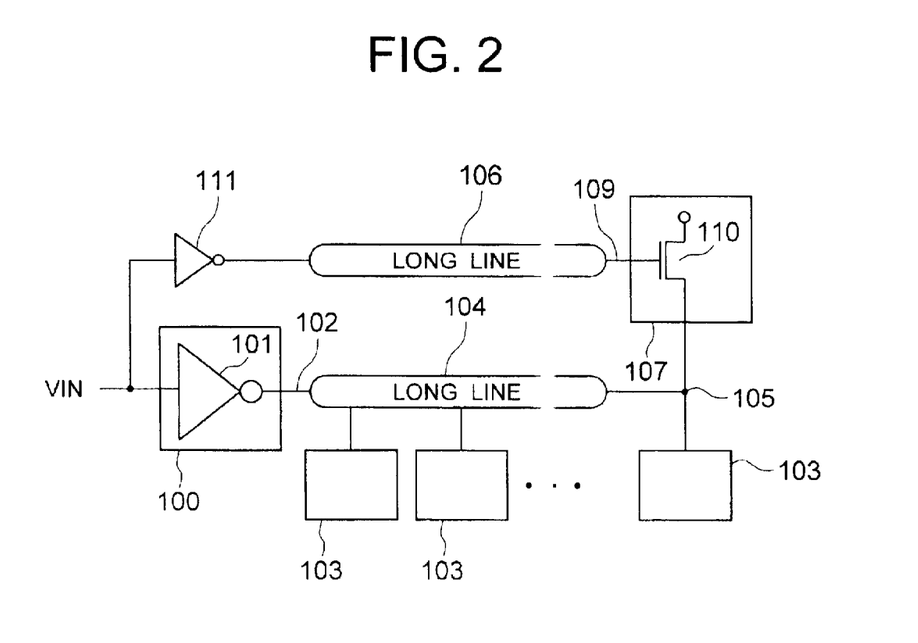
FIG. 2 shows a semiconductor integrated circuit device according to a second embodiment of the present invention.

FIG. 2 shows a second embodiment of the present invention.

In this embodiment the speed-increasing circuit 107 explained in the first embodiment is realized by an NMOS transistor 110 instead of the PMOS transistor 108. In order to obtain the same circuit operation as the first embodiment, a buffer circuit 111 is provided at the input side of the second long-distance wiring 106 for polarity matching. The other parts of the configuration are identical as the first embodiment. With this configuration, it is possible to obtain the same effect as the aforementioned first embodiment. It should be noted that in the first embodiment, the first long-distance wiring 104 has an opposite polarity of the second long-distance wiring 106 and there is a danger of generation of a cross talk between the two of the long-distance wiring. In contrast to this, with this configuration the polarities are identical and there is no danger of generating a cross talk between the two of the long-distance wiring.

Figure 3:
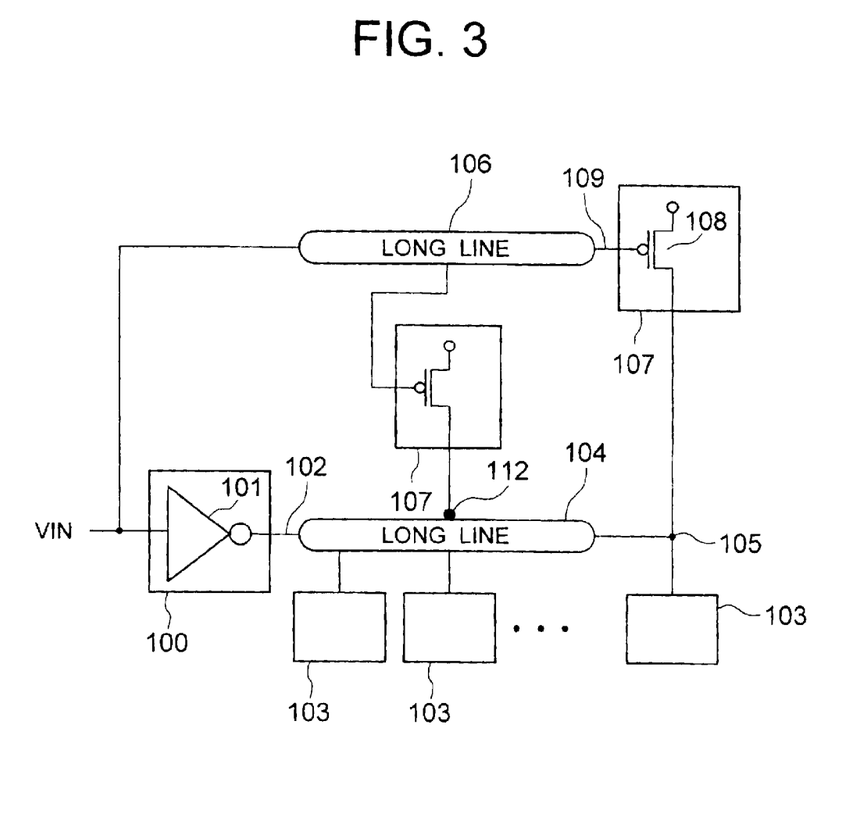
FIG. 3 shows a semiconductor integrated circuit device according to a third embodiment of the present invention.

FIG. 3 shows the third embodiment of the present invention.

In the first embodiment (FIG. 1), the signal change is accelerated by providing the speed-increasing circuit 107 at the node 105 in the vicinity of the input terminal of the gate circuit 103 arranged physically at the farthest end viewed from the output node 102 of the CMOS inverter 101. In this case, however, a path passing through a node in the vicinity of the input terminal of the gate circuit 103 arranged in the middle of the first long-distance wiring 104 becomes a critical path. Accordingly, by additionally inserting a speed-increasing circuit 107 at the position of the node 112 in the vicinity of that gate circuit 103, it is possible to obtain a higher speed than in the first embodiment. This third embodiment of the present invention is shown in FIG. 3.

In this embodiment a single speed-increasing circuit 107 is additionally inserted at the middle of the first long-distance wiring 104 but by further inserting such circuits, it is possible to further reduce the wiring delay time. Any number of speed-increasing circuit 107 may be inserted. The number of the speed-increasing circuits 107 inserted and their size may be selected so as to minimize the wiring delay time while considering the number of the fan outs of the driver circuit 100, and the wiring line width connected to the output of the driver circuit 100. This embodiment has an effect to selectively increase the speed of the critical path using simple means.

Figure 4:
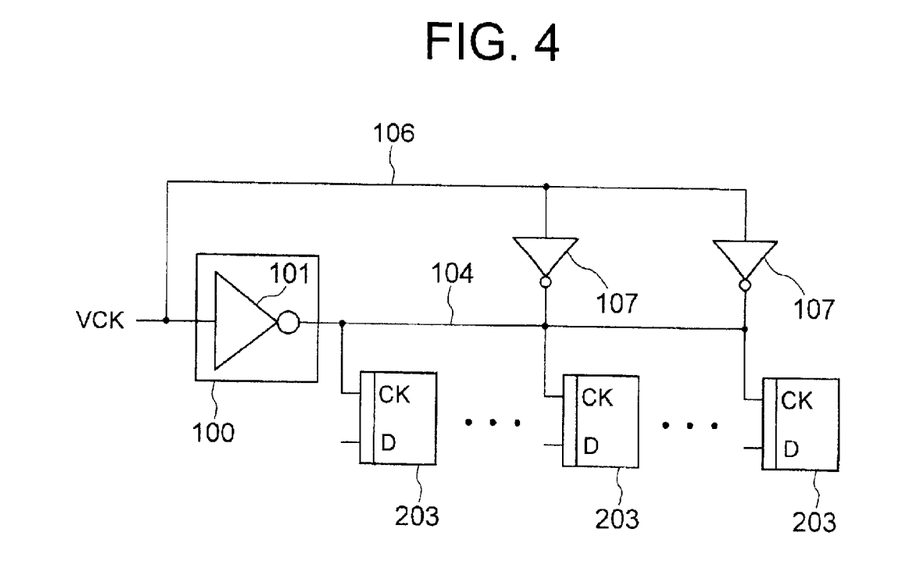
FIG. 4 shows a first application example of the semiconductor integrated circuit device according to the embodiment of the present invention.

FIG. 4 shows a first application example of the present invention.

This application example for applying the third embodiment to the clock distribution method employs a clock input signal VCK as the input signal VIN, a clock driver as the driver circuit 100, and a flip-flop circuit 203 as the gate circuit. In this application example, an input of the clock driver circuit 100 is connected to a clock input terminal CK of the flip-flop circuits 203 in the farthest end and at the middle viewed from the clock driver circuit 100 (CMOS inverter 101) at the speed-increasing circuit (inverter circuit) 107.

Figure 5:
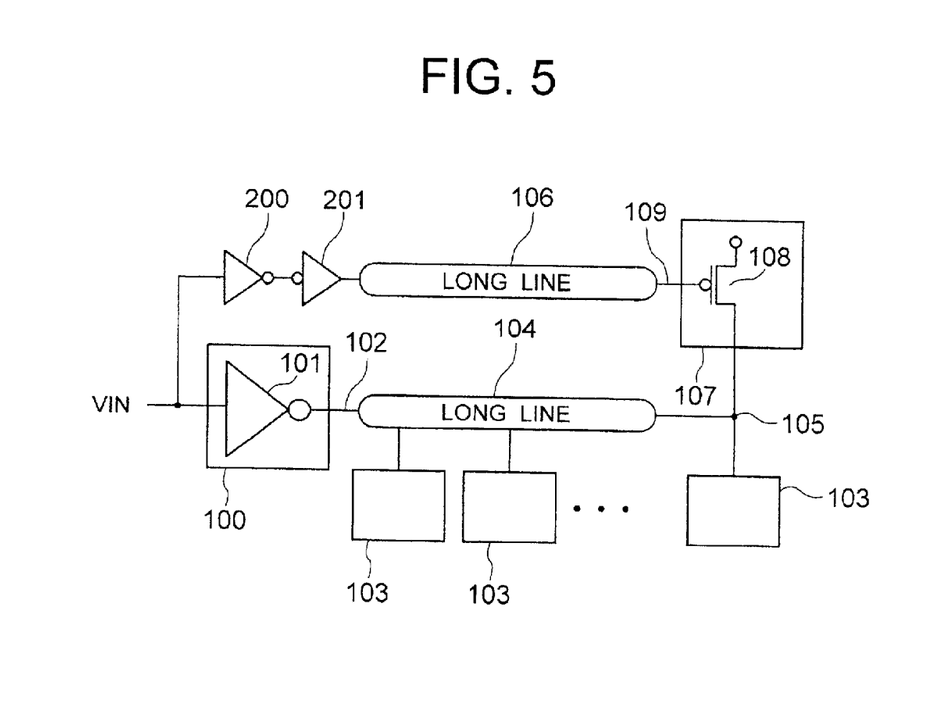
FIG. 5 shows a semiconductor integrated circuit device according to a fourth embodiment of the present invention.

FIG. 5 shows a fourth embodiment of the present invention.

The fourth embodiment has a basic configuration identical to the first embodiment (FIG. 1) except for a buffer circuit 200 and a buffer circuit 201 arranged between an input of the driver circuit 100 and an input side end of the second long-distance wiring 106. In the circuit configuration of the first embodiment, the load driven by the driver circuit 100 includes an input capacity of the CMOS inverter 101 and a wiring capacity and resistance of the second long-distance wiring 106. When the load of this second long-distance wiring 106 remarkably increases the delay of the input signal VIN from the drive circuit, eliminating the effect of the speed increase, the present embodiment has a significant effect. That is, by selecting a minimum MOS size of the buffer circuit 200 (and a larger size of the buffer circuit 201) and reducing the load of the second long-distance wiring 106, the buffer circuit 201 can drive the long-distance wiring 106 and the speed-increasing circuit 107 without deteriorating the delay of the input signal VIN. Although a delay overhead equivalent two stages of a buffer circuit is present, by tuning the element device, power source voltage, process, or the buffer circuit and the speed-increasing circuit element size, it is possible to obtain a greater effect than the speed increase by the first embodiment. The operation is identical as the first embodiment and its explanation is omitted here.

In the aforementioned first to fourth embodiments, the drive method for all-at-once driving a plenty of fan outs and long-distance wiring lines may be a clock distribution method (used in the first application example) having a clock driver for driving a plurality of flip-flops, a memory word line drive method (used in the second application example as will be detailed later), or a path including a driver for driving a plurality of selector circuit control lines. In any of the methods, it is possible to obtain the effects explained in the first to the fourth embodiments and improve the operation speed.

Figure 6:
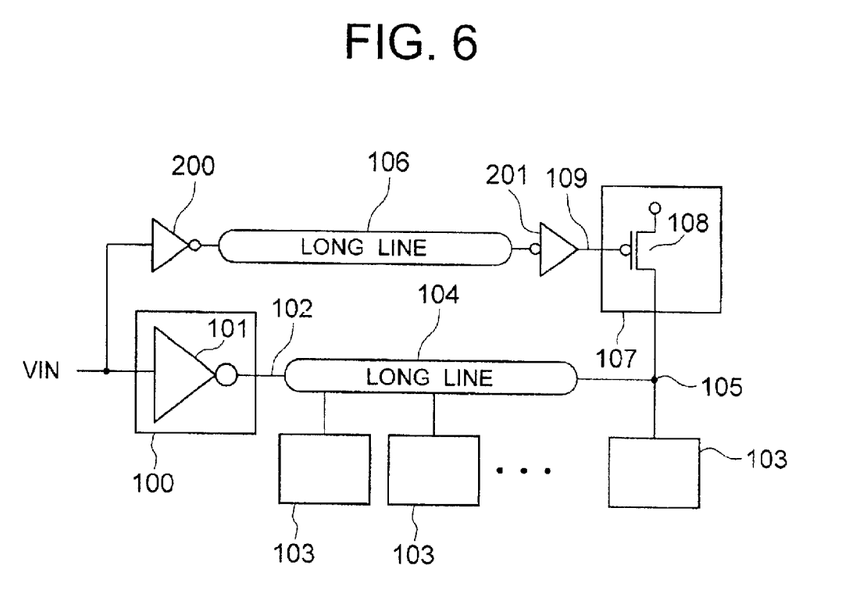
FIG. 6 shows a semiconductor integrated circuit device according to a fifth embodiment of the present invention.

FIG. 6 shows a fifth embodiment of the present invention.

This embodiment differs from the aforementioned circuit configuration of the fourth embodiment (FIG. 5) in that the buffer circuit 201 is arranged after the second long-distance wiring 106. That is, by using the buffer circuit 201 to correct the voltage waveform which has passed through the second long-distance wiring 106, before passing the voltage waveform to the speed-increasing circuit 107, the response characteristic of the PMOS transistor 108 is improved. This also increases the voltage response of the node 105 and further reduces the wiring delay of the long-distance wiring 104.

Figure 7:
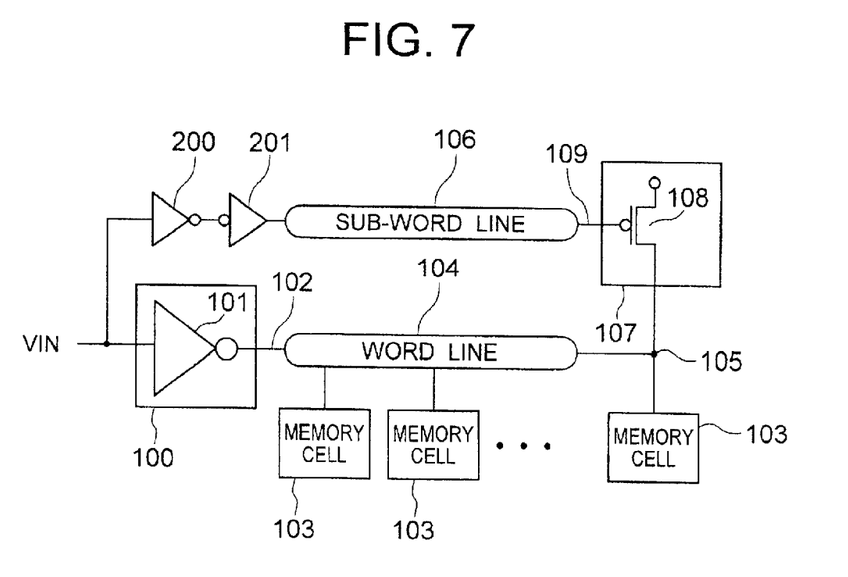
FIG. 7 shows a second application example of the semiconductor integrated circuit device according to the embodiment of the present invention.

FIG. 7 shows the second application example of the present invention.

This application example shows the aforementioned fourth embodiment (FIG. 5) applies to the memory word line drive method. The circuit configuration is completely identical to that of the fourth embodiment. The gate circuit 103 is realized by a memory cell 303, the first long-distance wiring line 104 is realized by a word line WL, and the second long-distance wiring 106 is realized by a sub-word line. The memory cell 303 is activated to read out or write in data (word line selected state) when the input signal VIN is changed from high to low and the word line WL 104 is changed from low to high. On the contrary, when the word line WL 104 is changed from high to low, the memory cell is dis-activated and does not perform data read out or write in (word line non-selected state).

Figure 8:
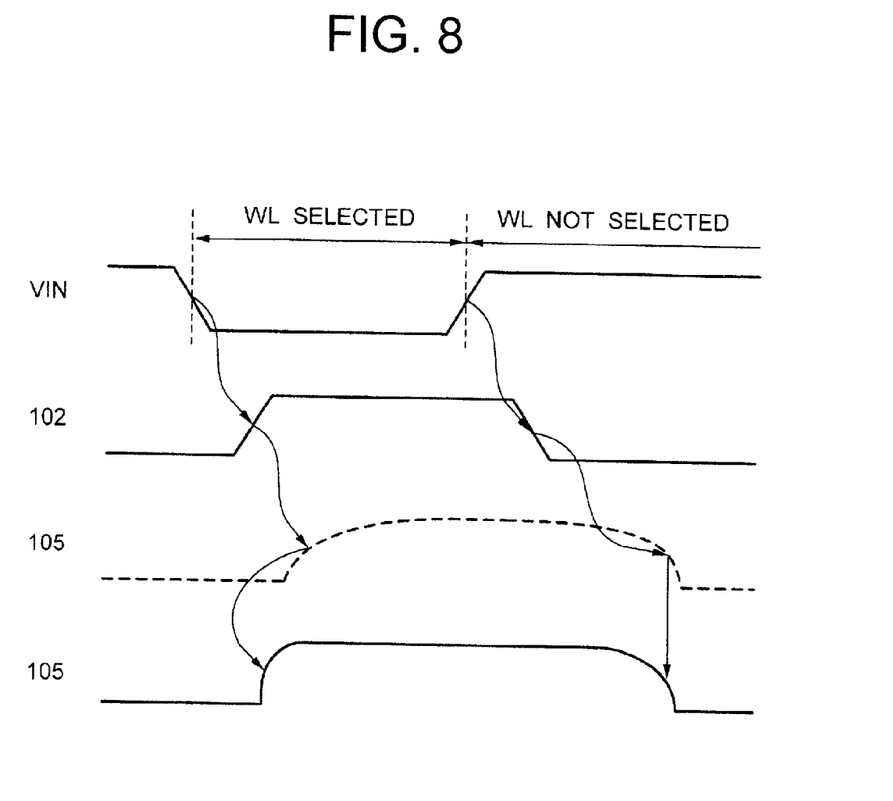
FIG. 8 is a timing chart explaining a circuit operation of the second application example of the semiconductor integrated circuit according to the embodiment of the present invention.

Next, explanation will be given on the circuit operation by using the timing chart of FIG. 8. The figure shows two operation waveforms of the node 105. The waveform shown by a dotted line is a waveform obtained when not providing a by-pass circuit including buffer circuits 200 and 201, the sub-word line 106, and the PMOS transistor 108. When the input signal VIN (word line selecting signal) from a decoding circuit (not depicted) for selecting the word line WL reaches the word line driver 100 and the input signal VIN is changed from high to low (word line selected state), an output node 102 of the word line driver 100 is changed from low to high. And the node 105 in the vicinity of the input terminal of the memory cell 303 arranged at the farthest bit viewed from the word line driver 100 is also changed from low to high after the wiring delay time of the word line 104. The waveform in the dotted line a dull rise. Accordingly, the response of the memory cell receiving the waveform is slow and the wiring delay time of the word line is great. Next, in the waveform of the node 105 shown by a solid line, when the input signal VIN is changed from high to low, the node 109 via the buffer circuits 200 and 201 and the sub-word line 106 is also changed from high to low, and the PMOS transistor 108 turns on. The word line 104 and the sub-word line 106 have an identical length but the sub-word line 106 has a by far shorter wiring delay time than the word line 104 because no memory cell 303 is connected as fan outs for the number of bits. By tuning the element size of the buffer circuits 200 and 201 and the PMOS transistor 108, the voltage waveform of the node 105 starts rising at an early time as compared to the waveform shown by a dotted line in the figure. Moreover, since drive directly by the PMOS transistor, the waveform rises sharply as compared to the waveform shown by a dotted line, like the rising waveform of the node 102. Accordingly, in the word line WL selected state, the memory cell 303 rapidly reads out, thereby significantly reducing the wiring delay time of the word line WL. When the input signal VIN turns from low to high (word line non-selected state), the output node 102 of the word line driver 100 turns from high to low. And the memory cell 303 is dis-activated and does not perform data read out. In this case, the PMOS transistor 108 is cut out and the trailing waveform of the node 105 is identical in the dotted line and the solid line in the figure.

Figure 9:
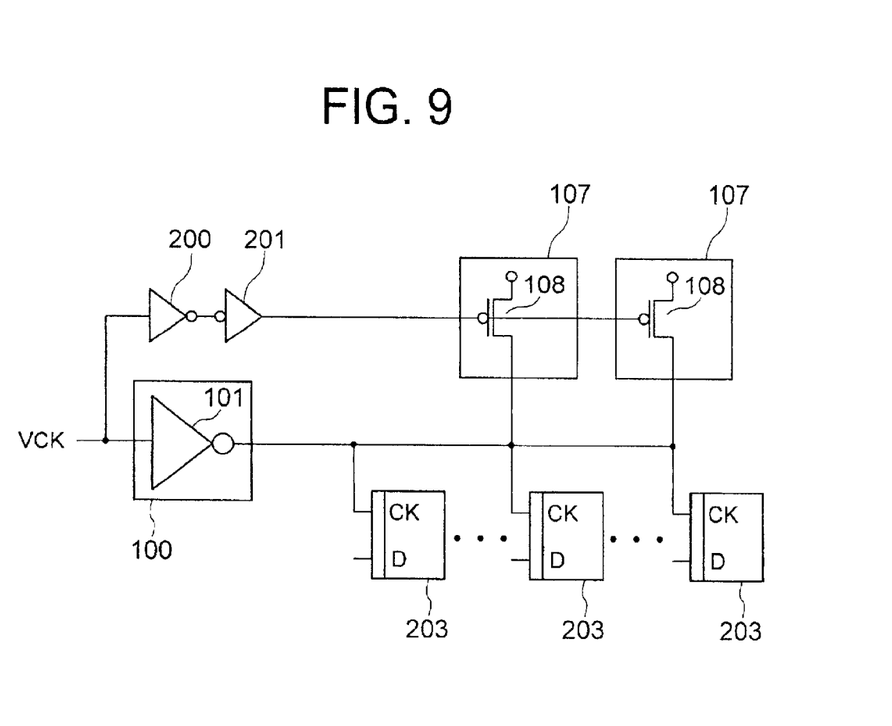
FIG. 9 shows a third application example of the semiconductor integrated circuit device according to the embodiment of the present invention.

FIG. 9 shows a third application example of the present invention.

This application example is a combination of the third embodiment (FIG. 3) and the fourth embodiment (FIG. 5) which is applied to the clock distribution method. In the figure, VCK represents a clock input signal, 100 represents a clock driver circuit, and 203 represents a flip-flop circuit. In this application example, clock input terminals CK of the flip-flop circuit 203 arranged at the farthest end and in the middle viewed from the output of the clock driver circuit 100 are connected by the speed-increasing circuit 107. In this application example, the speed-increasing circuit 107 is inserted at two positions but may be inserted at more positions as has been detailed in the third embodiment and the explanation is omitted here.

Figure 10:
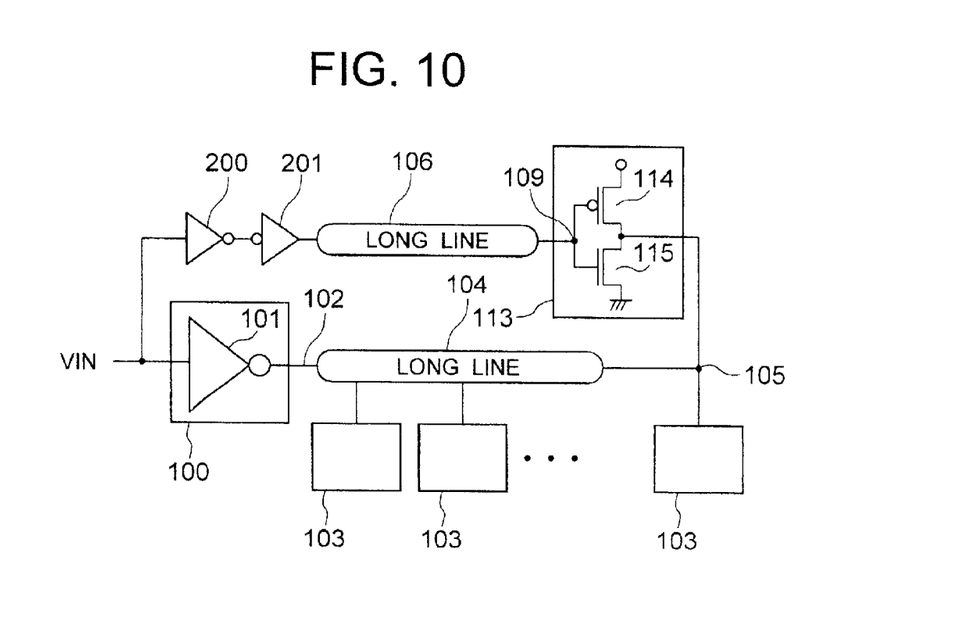
FIG. 10 shows a semiconductor integrated circuit device according to a sixth embodiment of the present invention.

FIG. 10 shows a sixth embodiment of the present invention.

In this embodiment, the speed-increasing circuit 107 explained in the fourth embodiment (FIG. 5) is replaced by a speed-increasing circuit 113 including a CMOS inverter having a PMOS transistor 114 and an NMOS transistor 115.

In this embodiment, the operation differs from that of the fourth embodiment in the operation of the speed-increasing circuit 113. When the input signal VIN is changed from low to high, an input node 109 of the speed-increasing circuit 113 via the buffer circuits 200 and 201 and the second long-distance wiring 106 is also changed from low to high and the NMOS transistor of the speed-increasing circuit 113 turns on, thereby decreasing the potential of the node 105 to low (grounding potential) (at this moment, the PMOS transistor 114 is off). When the input signal VIN is changed from high to low, the input node 109 of the speed-increasing circuit 113 is also changed from high to low and the PMOS transistor of the speed-increasing circuit 113 turns on, thereby increasing the potential of the node 105 to high (power supply potential (at this moment, the NMOS transistor 115 is off).

Since this embodiment operates as has been described above, this embodiment enables to obtain a high-speed operation at the long-distance wiring voltage change trail in the same way as at its rise in contrast to the aforementioned embodiments which enable to obtain a high-speed operation only at the rise of the long-distance wiring voltage change.

Especially in the second application example (FIG. 7 and FIG. 8), by configuring the speed-increasing circuit 107 as the present embodiment, it is possible to obtain a high speed in the word line non-selected state, too, as in the selected state.

What is claimed is:

1. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein the speed-increasing circuit includes a PMOS transistor.

2. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein the speed-increasing circuit includes an NMOS transistor and a buffer circuit is inserted at an input side of the second-long distance wiring.

3. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein the speed-increasing circuit includes a CMOS inverter having a PMOS transistor and an NMOS transistor.

4. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein a plurality of speed-increasing circuits are additionally inserted between an intermediate position of the second long-distance wiring and the vicinity of the input terminal of the gate circuit connected to a position corresponding to that intermediate position.

5. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein a plurality of buffer circuits are inserted at the input side of the second long-distance wiring.

6. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein a buffer circuit is inserted at the input side of the second long-distance wiring, and a buffer circuit is inserted at the output side of the second long-distance wiring.

7. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein the input signal (VIN) is realized by a word line selecting signal; the driver circuit is realized by a word line driver; the first long-distance wiring is realized by a word line (WL); and the gate circuits are realized by memory cells.

8. A semiconductor integrated circuit device comprising a driver circuit, a first long-distance wiring connected to the driver circuit, and a plurality of gate circuits connected over the entire length of the first long-distance wiring, so that an input signal (VIN) is received by the plurality of gate circuits via the driver circuit and the first long-distance wiring, wherein a node arranged in the vicinity of an input terminal of the gate circuit located furthest away on the first long-distance wiring from an output of the driver circuit and an input terminal of the driver circuit are connected through a second long-distance wiring and a speed-increasing circuit, and wherein the input signal (VIN) is realized by a clock input signal (VCK); the driver circuit is realized by a clock driver; and the gate circuits are realized by flip-flop circuits.

9. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein the speed-increasing circuit includes an NMOS transistor and a buffer circuit is inserted at an input side of the second long-distance wiring.

10. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein the speed-increasing circuit includes a CMOS inverter having a PMOS transistor and an NMOS transistor.

11. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein a plurality of speed-increasing circuits are additionally inserted between an intermediate position of the second long-distance wiring and the vicinity of the input terminal of the gate circuit connected to a position corresponding to the intermediate position.

12. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein a plurality of buffer circuits are inserted at the input side of the second long-distance wiring.

13. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein a buffer circuit is inserted at the input side of the second long-distance wiring, and a buffer circuit is inserted at the output side of the second long-distance wiring.

14. A semiconductor integrated circuit device comprising a driver circuit, a first long-distance wiring connected to the driver circuit, and a plurality of gate circuits connected over an entire length of the first long-distance wiring, so that an input signal (VIN) is received by the plurality of gate circuits via the driver circuit and the first long-distance wiring, wherein a node arranged in a vicinity of an input terminal of the gate circuit connected to an end of the first long-distance wiring and an input terminal of the driver circuit are connected through a second long-distance wiring and a speed-increasing circuit, wherein the input signal (VIN) is realized by a clock input signal (VCK); the driver circuit is realized by a clock driver; and the gate circuits are realized by flip-flop circuits.

15. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein the speed-increasing circuit includes a PMOS transistor.

16. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein the speed-increasing circuit includes an NMOS transistor and a buffer circuit is inserted at an input side of the second wiring.

17. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein the speed-increasing circuit includes a CMOS inverter having a PMOS transistor and an NMOS transistor.

18. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein a plurality of speed-increasing circuits are additionally inserted between an intermediate position of the second wiring and the vicinity of the input terminal of the gate circuit connected to a position corresponding to the intermediate position.

19. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein a plurality of buffer circuits are inserted at the input side of the second wiring.

20. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein a buffer circuit is inserted at the input side of the second wiring.

21. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the pate circuits coupled to an end of the first wiring, and wherein the input signal is realized by a word line selecting signal; the driver circuit is realized by a word line driver; the first wiring is realized by a word line; and the gate circuits are realized by memory cells.

22. A semiconductor integrated circuit device comprising a driver circuit, a first wiring coupled to the driver circuit, a plurality of gate circuits coupled over an entire length of the first wiring so that an input signal is received by the plurality of gate circuits via the driver circuit and the first wiring, and a second wiring and a speed-increasing circuit coupled between a first node and a second node, said first node being at an input terminal of the driver circuit and said second node being in a vicinity of an input terminal of one of the gate circuits coupled to an end of the first wiring, and wherein the input signal is realized by a clock input signal; the driver circuit is realized by a clock driver; and the gate circuits are realized by flip-flop circuits.

* * * * *